United States Patent
Popp et al.

(10) Patent No.: US 7,119,384 B2
(45) Date of Patent: Oct. 10, 2006

(54) FIELD EFFECT TRANSISTOR AND METHOD FOR FABRICATING IT

(75) Inventors: Martin Popp, Dresden (DE); Frank Richter, Dresden (DE); Dietmar Temmler, Dresden (DE); Andreas Wich-Glasen, Langebrück (DE)

(73) Assignee: Infineon Technologies AG, München (DE)

( * ) Notice: Subject to any disclaimer, the term of this patent is extended or adjusted under 35 U.S.C. 154(b) by 31 days.

(21) Appl. No.: 10/482,331

(22) PCT Filed: Jun. 25, 2002

(86) PCT No.: PCT/EP02/07028

§ 371 (c)(1),
(2), (4) Date: Oct. 5, 2004

(87) PCT Pub. No.: WO03/003442

PCT Pub. Date: Jan. 9, 2003

(65) Prior Publication Data

US 2005/0029583 A1    Feb. 10, 2005

(30) Foreign Application Priority Data

Jun. 28, 2001  (DE) .............................. 101 31 276

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. .............. 257/250; 257/314; 257/315; 257/329; 257/330; 257/331; 257/622; 257/623; 257/E21.609; 257/E21.693; 257/E29.201

(58) Field of Classification Search ................ 257/250, 257/329–332, 622, 623, E21.609, E21.693, 257/E29.201

See application file for complete search history.

(56) References Cited

U.S. PATENT DOCUMENTS 4,764,799 A * 8/1988 Malaviya .................... 257/514

(Continued)

FOREIGN PATENT DOCUMENTS

WO    WO 00/30181    5/2000

OTHER PUBLICATIONS

Xuejue Huang et al., "Sub 50-nm FinFET: PMOS," Dept. of Electrical Engineering and Computer Sciences, University of California at Berkeley, CA 94720.

* cited by examiner

*Primary Examiner*—Jerome Jackson
*Assistant Examiner*—Jesse A. Fenty
(74) *Attorney, Agent, or Firm*—Morrison & Foerster LLP

(57) ABSTRACT

The invention relates to a field effect transistor in which the planar channel region on the upper surface of the elevation is extended in width by means of additional vertical channel regions on the lateral surfaces of the elevation. Said additional vertical channel regions connect directly to the planar channel region (vertical extended channel regions). Said field effect transistor has the advantage that a significant increase in the effective channel width for the current flow $I_{ON}$ can be guaranteed relative to conventional transistor structures used up until the present, without having to accept a reduction in the achievable integration density. Said field effect transistor furthermore has a low reverse current $I_{OFF}$. The above advantages are achieved without the thickness of the gate insulators up to the region of the charge transfer tunnels having to be reduced or a reduced stability.

19 Claims, 5 Drawing Sheets

U.S. PATENT DOCUMENTS

| | | |
|---|---|---|
| 4,979,014 A | 12/1990 | Hieda et al. |
| 5,391,506 A | 2/1995 | Tada et al. |
| 5,512,517 A * | 4/1996 | Bryant .................. 438/302 |
| 5,567,959 A | 10/1996 | Mineji |
| 5,583,362 A | 12/1996 | Maegawa |
| 5,844,278 A | 12/1998 | Mizuno et al. |
| 6,022,783 A * | 2/2000 | Wu ........................ 438/303 |
| 6,525,403 B1 * | 2/2003 | Inaba et al. ............ 257/618 |
| 6,768,158 B1 * | 7/2004 | Lee et al. ............... 257/315 |
| 6,894,339 B1 * | 5/2005 | Fan et al. ............... 257/314 |
| 6,903,967 B1 * | 6/2005 | Mathew et al. ......... 365/177 |
| 6,969,656 B1 * | 11/2005 | Du et al. ................ 438/268 |

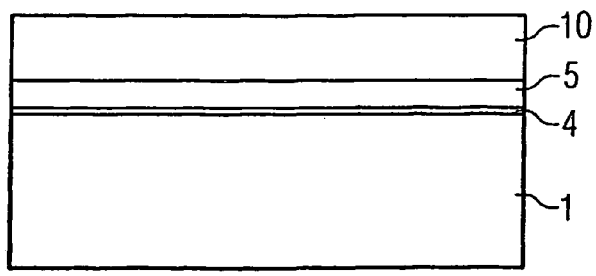
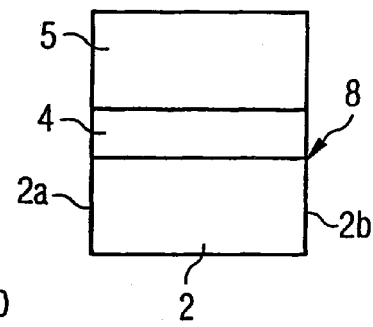
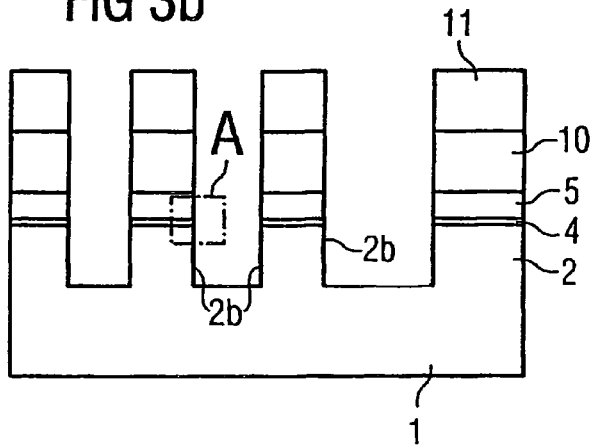
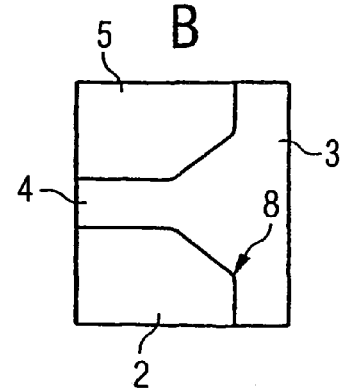
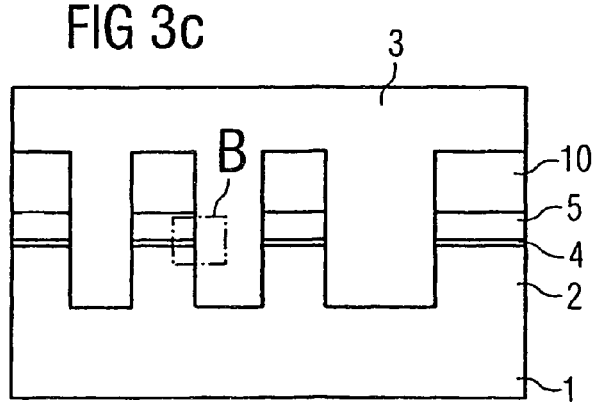

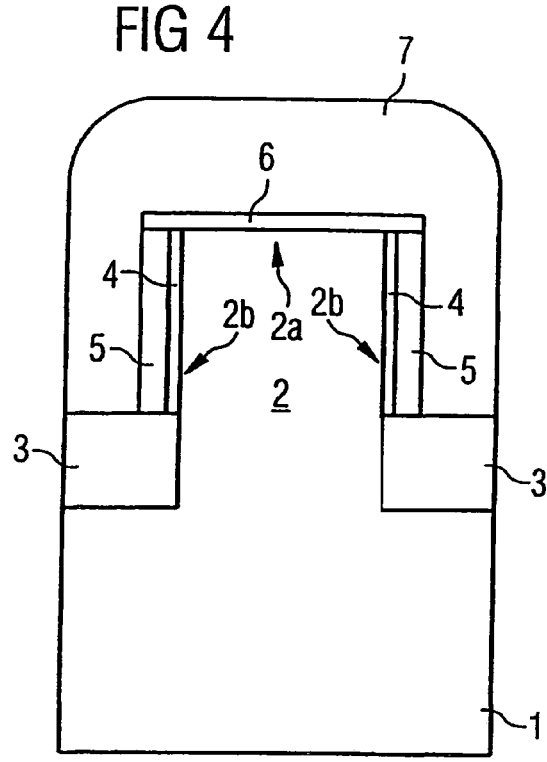
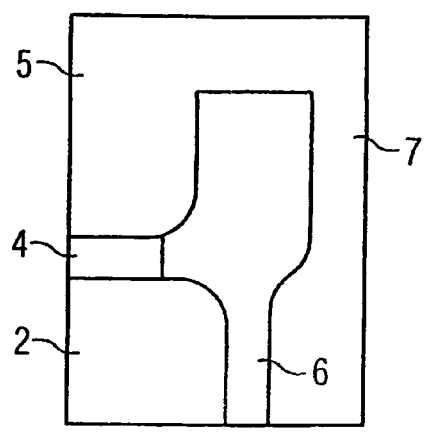
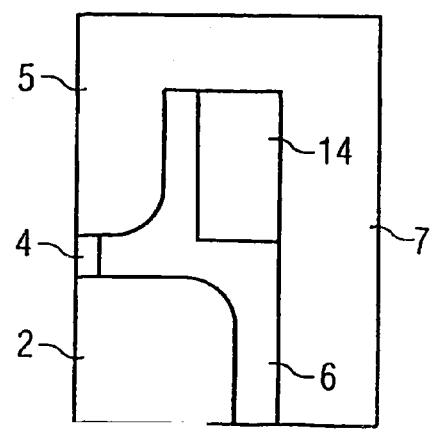

FIELD EFFECT TRANSISTOR AND METHOD FOR FABRICATING IT

CLAIM FOR PRIORITY

This application is a national stage of PCT/EP02/07028, filed in the German language on Jun. 25, 2002, and which claims the benefit of priority to German Application No. DE 101 31276.8, filed in the German language on Jun. 28, 2001.

TECHNICAL FIELD OF THE INVENTION

The present invention relates to a field-effect transistor and a method for fabricating it.

BACKGROUND OF THE INVENTION

The characteristic parameters of conventional field-effect transistors, in particular of planar MIS field-effect transistors (MISFET), are increasingly impaired with continual structural miniaturization (scaling) and increasing of the packing density of integrated circuits. Thus, by way of example, with a shortened channel length of the transistor the threshold voltage $V_T$ of the transistor decreases. At the same time, with a shortened channel length, the field strength in the channel region and the reverse current $I_{OFF}$ increase (SCE: short channel effect; roll-off). Furthermore, with a reduced channel width, the forward current $I_{ON}$ varies in a non-linear manner. In addition, the geometry and doping of the field-effect transistor are modified at the junction between the channel and the insulation. Generally, in the event of scaling, the channel boundaries gain in relative importance with respect to the central channel region (NCE: narrow channel effect, INCE: inverse narrow channel effect).

In order, despite the difficulties mentioned, to be able to ensure an improvement/maintenance of the performance of field-effect transistors in the context of advancing structural miniaturization (scaling), a series of measures are proposed or implemented. Thus, by way of example, a matched scaling of the internal operating voltage levels is effected at the same time as the MISFET scaling. Furthermore, the doping profiles of the well and channel regions and also of the source and drain regions are generally optimized. At the same time, scaling of the gate insulator with regard to thickness and material is usually carried out.

Further improvements result from the use of salicided source and drain regions (S/D) and salicided gate electrodes. A further improvement can be obtained by minimization of the parasitic resistances or capacitances of the connection metallization, for example through the use of copper wiring, and of the intermediate insulators, for example through the use of so-called "low-k" materials. In the case of DRAM memory cells, it is also possible to adapt the read-out logic to the "ON", currents—which decrease with each "shrink"—of the respective array transistors (e.g. reduction of the resistances of the gate tracks).

A further possibility for maintaining or improving the performance of field-effect transistors consists in the use of modified transistor arrangements which, for example, have elevated source/drain regions ("elevated S/D") or which are based on a so-called "silicon on insulator" technology (SOI) or which have a material with a higher carrier mobility, e.g. SiGe, in the channel region. Additional possibilities which result when the operating temperature is lowered are not presented here.

The introduction of the trench field isolation (STI: shallow trench isolation) instead of conventional LOCOS field isolation likewise contributes to improving the situation. If a trench field isolation (STI: shallow trench isolation) is used instead of a conventional LOCOS field isolation, then it is generally necessary to take additional measures to minimize the so-called "inverse narrow channel effect" (INCE). Thus, by way of example, a positive step height of the STI upper edge above the semiconductor surface is set in order to avoid a so-called "wraparound gate". Furthermore, a local doping of the transistor channel at the junction with the field isolation, the so-called "corner region", may be provided in addition to the normal channel doping.

Oxidation of the STI sidewalls during the STI processing may result in the production of a so-called "bird's beak geometry" and edge rounding of the active regions at the junction with the trench isolation. In the process sequence, the terms mentioned here are "corner rounding", "mini LOCOS" or "post CMP oxidation". These measures also serve to counteract the "inverse narrow channel effect" (INCE). This effect can be reinforced by prior lateral etching-back of the pad oxide. Edge rounding of the active regions can also be produced by means of thermal surface transformation. Furthermore a nitride spacer guard ring may be provided. In order to avoid a gate overlap over the corner region, it is possible to provide a self-aligned termination of the gate edge before the field isolation boundary. This may be done for example by joint patterning of poly-gate and active region during the STI patterning.

Despite all these measures, however, it is becoming more and more difficult to ensure adequate forward currents ION above a feature size of about 100 nm, without the risk of tunneling or degradation of the gate oxide stability of the MISFET. Therefore, a series of alternative transistor arrangements have been proposed.

The document U.S. Pat. No. 4,979,014 discloses a MOS transistor having a web-type elevation on a semiconductor substrate. The channel of this transistor is arranged along the web-type elevation and has, besides the channel region at the top side of the web-type elevation, two further channel regions at the side walls of the web-type elevation. The transistor in accordance with document U.S. Pat. No. 4,979,014 exhibits a pronounced "corner effect", which is used to produce a large depletion zone.

The document Huang et al. "Sub 50 nm FinFET; PMOS" IEDM 1999 discloses a transistor called "FinFET", which has a dual gate structure at the side walls of the web-type elevation ("Fin"). The FinFET avoids the INCE by means of a thicker insulator layer on the narrow Fin covering surface.

Unfortunately, all of the measures mentioned either have only limited efficacy or they require a high process engineering outlay.

SUMMARY OF THE INVENTION

The present invention provides a field-effect transistor and a method for fabricating it which reduce or avoid the abovementioned difficulties. In particular, the present invention provides a field-effect transistor makes available an adequate forward current ION and which can be fabricated with a low outlay, compatibly with the previous conventional integration process for planar MOSFETs.

One embodiment of the present invention provides a field-effect transistor which comprises of the following features:

a) at least one web-type elevation, which is arranged on a semiconductor substrate and has an upper surface and lateral surfaces, b) a first gate oxide layer, which is arranged on the upper surface of the web-type elevation, c) a first gate electrode, which is arranged on the first gate oxide layer, the first gate electrode having an upper surface and lateral surfaces, d) a second gate oxide layer, which is arranged at least on a part of the lateral surfaces of the web-type elevation and the first gate electrode, e) a second gate electrode, which is arranged on the second gate oxide layer and the upper surface of the first gate electrode and f) source and drain regions, which are arranged on the elevation.

A further embodiment of the present invention provides a field-effect transistor comprising the following features:

a) at least one web-type elevation, which is arranged on a semiconductor substrate and has an upper surface and lateral surfaces, b) a first gate oxide layer, which is arranged at least on a part of the lateral surfaces of the web-type elevation, c) a first gate electrode, which is arranged on the first gate oxide layer, the first gate electrode layer having an upper surface and lateral surfaces, d) a second gate oxide layer, which is arranged on the upper surface of the web-type elevation and the upper surface of the first gate electrode, e) a second gate electrode, which is arranged on the second gate oxide layer and the lateral surfaces of the first gate electrode, and f) source and drain regions, which are arranged on the elevation.

Further, another embodiment of the invention provides a method for fabricating a field-effect transistor, which comprises the following steps:

a) a semiconductor substrate with a first gate oxide layer applied thereon and a first gate electrode layer applied to the gate oxide layer is provided, b) at least one web-type elevation with an upper surface and lateral surfaces is produced, the first gate oxide layer and the first gate electrode layer being arranged on the upper surface, c) a second gate oxide layer is produced at least on a part of the lateral surfaces of the web-type elevation and the first gate electrode layer, d) a second gate electrode layer is applied, so that the second gate electrode layer is arranged on the second gate oxide layer and the upper surface of the first gate electrode layer, and e) the first and second gate electrode layers are patterned to form first and second gate electrodes and source and drain regions are produced.

The field-effect transistor according to the invention has the advantage that a significant increase in the effective channel width for the forward current ION can be ensured compared with previously known, conventional transistor structures, without having to accept a reduction of the integration density that can be attained. In the case of the field-effect transistor according to the invention, the planar channel region at the upper surface of the elevation is extended in width by additional vertical channel regions at the side areas of the elevation. These additional vertical channel regions directly adjoin the planar channel region (vertical extended channel regions). Furthermore, the field-effect transistor according to the invention has a small reverse current $I_{OFF}$. These advantages are obtained without having to reduce the thickness of the gate insulator into the region of the tunneling of charge carriers or reduced stability.

In this case, the additional vertical channel regions are obtained according to the invention by utilizing the vertical semiconductor surfaces which can preferably be produced analogously to the conventional planar transistor arrangement during the STI patterning ("shallow trench isolation") and form the vertical STI sidewalls. The process for fabricating the transistor according to the invention is thus so closely related to the process sequence of the conventional STI-isolated, planar transistor that conventional, planar transistors can be integrated and combined very simply on the same chip with transistors according to the invention.

Between the planar channel region and the vertical channel regions there exists a transition region in the form of a convexly curved edge, arranged in the source/drain direction, on the web-type elevation as constituent part of the active channel. In the case of previously proposed transistor arrangements, this edge always led to a pronounced "corner effect" which adversely influenced the threshold voltage of the transistor. In the case of the field-effect transistor according to the invention, this problem is largely avoided by the special enclosure arrangement which has the first and second gate oxide layers and also the first and second gate electrodes.

In accordance with one preferred embodiment of the field-effect transistor according to the invention, the second gate oxide layer is made thicker on the lateral surfaces of the first gate electrode than on the lateral surfaces of the web-type elevation. Furthermore, it is preferred if an insulating spacer is arranged on the second gate oxide layer at the level of the first gate electrode. This makes it possible to further reduce the electric field strength at the edges.

In accordance with a further preferred embodiment of the field-effect transistor according to the invention, the edges of the web-type elevation are rounded between the upper surface and the lateral surfaces. This rounding can preferably be produced with the aid of a short high-temperature process. Accordingly, the transistor according to the invention can be processed with a significantly reduced temperature budget. This yields advantages interalia in respect of doping profiles and performance. Moreover, as a result, the transition region between the planar and vertical channel regions is kept small, and virtually the entire width and depth of the geometrical channel area can be utilized as active channel even in the event of a very highly scaled transistor geometry.

In this case, it is particularly preferred if the radius of curvature of the edges is of the order of magnitude of the layer thickness of the first or second gate oxide layer. Accordingly, the threshold voltage of the so-called "parasitic corner device" can be brought to a value which is greater than the value of the threshold voltage of the planar channel region. The resulting electric field strength along the surface of the edge curvature consequently does not exceed the electric field strength prevailing in the planar part of the channel.

In accordance with a further preferred embodiment of the field-effect transistor according to the invention, spacers are arranged between the source region and the gate electrodes and also between the drain region and the gate electrodes. Furthermore, it is preferred if the first gate electrode has a polysilicon layer. Moreover, it is particularly preferred if the second gate electrode has a polysilicon-metal double layer or a polycide layer. In accordance with a further preferred embodiment of the field-effect transistor according to the invention, the part of the lateral surfaces of the web-type elevation which is covered by a gate oxide layer is bounded by a trench isolation. Furthermore, it is particularly preferred if the doping profile depth of the source and drain regions is greater than the extent of the part of the lateral surfaces of the web-type elevation which is covered by a gate oxide layer.

In accordance with one preferred embodiment of the fabrication method according to the invention, the web-type elevation is produced with the patterning of the trenches for a trench isolation. In this case, it is particularly preferred if the trenches for the trench isolation are filled with oxide and etching-back, preferably after a CMP step, is carried out, so that a part of the lateral surfaces of the web-type elevation is uncovered.

In accordance with a further preferred embodiment of the fabrication method according to the invention, at least one thermal process is carried out for rounding the edges of the web-type elevation between the upper surface and the lateral surfaces. Furthermore, it is particularly preferred if the gate oxide layers are in each case produced by thermal oxidation.

In accordance with a further preferred embodiment of the fabrication method according to the invention, the second gate oxide layer is produced by selective oxidation, so that the second gate oxide layer is made thicker on the lateral surfaces of the first gate electrode than on the lateral surfaces of the web-type elevation. Furthermore, it is preferred if an insulating spacer is produced after the production of the first gate electrode layer, so that an insulating spacer is arranged on the second gate oxide layer at the level of the first gate electrode.

BRIEF DESCRIPTION OF THE DRAWINGS

The invention is explained in more detail below with reference to figures of the drawings, in which:

FIGS. 3a–3h show a first embodiment of the method according to the invention for fabricating a field-effect transistor.

FIG. 4 shows a further embodiment of the field-effect transistor according to the invention.

FIG. 5 shows a further embodiment of the field-effect transistor according to the invention.

FIG. 6 shows a further embodiment of the field-effect transistor according to the invention.

DETAILED DESCRIPTION OF THE INVENTION

Figure 1:
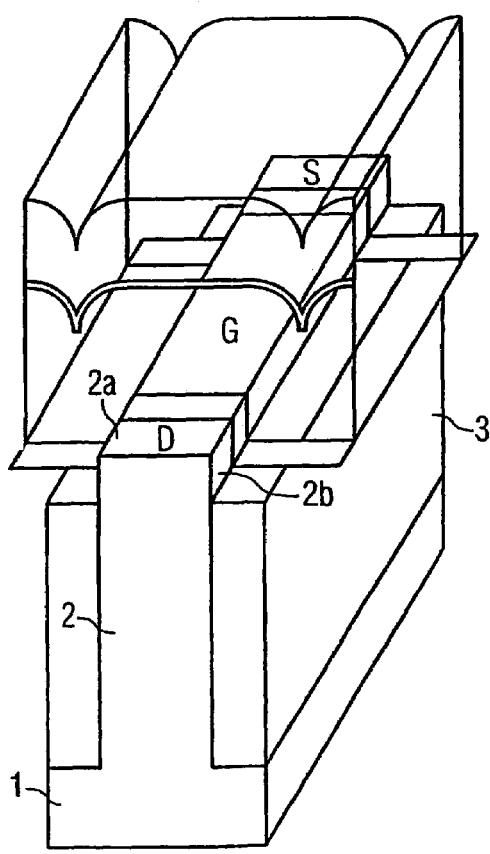
FIGS. 1 and 2 show a first embodiment of the field-effect transistor according to the invention.
Figure 2:
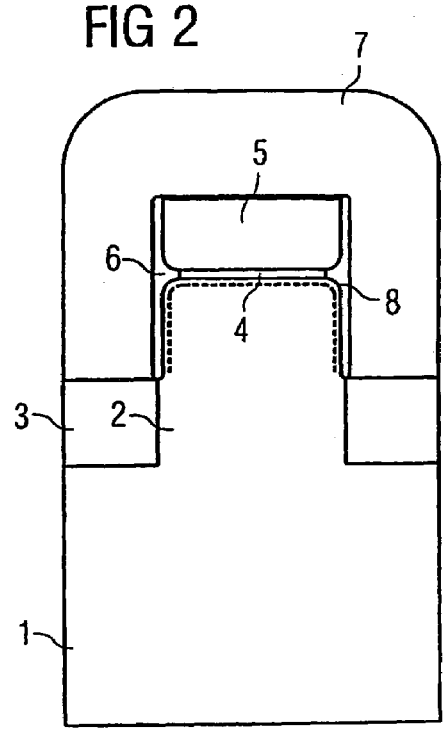

FIGS. 1 and 2 show a first embodiment of the field-effect transistor according to the invention. In this case, FIG. 1 shows the general structure of this embodiment of the field-effect transistor according to the invention, while FIG. 2 illustrates the details of this according be seen according which is embodiment of the field-effect transistor to the invention in a cross section. As can from FIG. 1, the field-effect transistor to the invention has a web-type elevation 2, arranged on a semiconductor substrate 1 and has an upper surface 2a and two lateral surfaces 2b. The web-type elevation 2 constitutes the active semiconductor region in this case.

The active semiconductor region 2 with vertical connection to the semiconductor substrate 1 is laterally insulated from adjacent active regions (not illustrated) by STI field isolation regions 3. The surface 2a, 2b of the active region is patterned into source and drain regions and also into a planar channel region. The web-type elevation 2 projects above the STI surface, as a result of which the side areas 2b of the active region are in part not covered by the isolation 3. These uncovered side areas, directly adjoining the corresponding planar regions, are patterned identically into source, drain and channel regions. In this case, the height difference between the active semiconductor region and the STI surface corresponds to the width of the vertical channel regions. The doping profile depth of the source and drain regions is preferably greater than the said height difference.

As can be seen from FIG. 2, the field-effect transistor according to the invention has a first gate oxide layer 4, which is arranged on the upper surface 2a of the web-type elevation 2. Furthermore, a first gate electrode 5 is provided, which is arranged on the first gate oxide layer 4, the first gate electrode having an upper surface and two lateral surfaces. A second gate oxide layer 6 is arranged on the lateral surfaces 2b of the web-type elevation 2 and the first gate electrode 4. Furthermore, a second gate electrode 7 is arranged on said second gate oxide layer 6 and on the upper surface of the first gate electrode 5.

The relief structure comprising active and sunk STI surface is thus covered by a double gate electrode in the channel region. In this case, the first gate electrode 5 is preferably composed of highly doped polysilicon, while the second gate electrode 7 preferably has a polysilicon-metal layer stack. In this case, the two gate electrodes 5, 7 are arranged such that the first gate electrode 5 covers exclusively the planar part of the active region and approximately terminates with the sidewalls thereof, while the second gate electrode 7 covers the vertical side walls of the active region and encloses the first gate electrode 5.

In this case, the second gate electrode 7 makes contact with the first gate electrode 5 on the planar surface thereof, while it is insulated from the lateral sidewalls thereof by the second gate oxide layer 6.

In the case of the present embodiment of the field-effect transistor according to the invention, the edge 8 of the active region is rounded. The radius of curvature of this rounding is of the order of magnitude of the gate oxide thickness. Furthermore, the channel region is flanked on the source and drain side by spacers (not shown) which laterally insulate the dual gate electrode 5, 7 from the S/D contact areas.

Figure 3D:
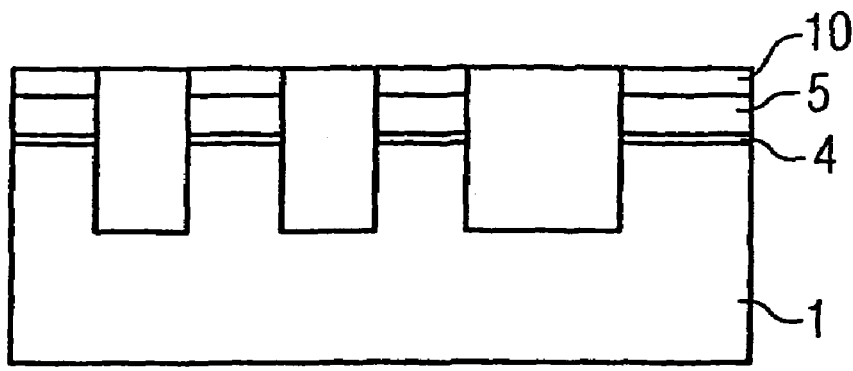

FIGS. 3a–3h show a first embodiment of the method according to the invention for fabricating a field-effect transistor. After a few preparatory fabrication steps, a first gate oxide layer 4 and also a first gate electrode layer 5 and pad nitride layer 10 are produced on a semiconductor substrate 1, in particular a silicon substrate. In this case, the gate oxidation can be carried out for example with the aid of a thermal oxidation. The gate electrode layer and pad nitride deposition is effected for example with the aid of CVD methods. The resultant situation is shown in FIG. 3a.

Afterward, using a resist mask 11, this layer stack is patterned together with the STI patterning. This joint patterning is effected for example with the aid of chemical-physical dry etching. Consequently, a web-type elevation 2 with an upper surface 2a and two lateral surfaces 2b is produced, the first gate oxide layer 4 and the first gate electrode layer 5 being arranged on the upper surface 2a. The edges 8 between the upper surface 2a and the two lateral surfaces 2b are cut sharply, virtually at 90° C., in this processing stage. The resultant situation is shown in FIG. 3b.

The following are then effected: the removal of the resist mask 11 and also cleaning and a brief thermal oxidation in order to improve the quality of the perpendicular side areas, and also sealing of the sidewalls of the first gate electrode layer 5. The surface relief produced is then filled with oxide 3 (FIG. 3c), thermally densified and planarized to a nitride residual thickness by means of a CMP method (chemical mechanical polishing) (FIG. 3d). The thermal processes of this processing section result in slight widening of the first gate oxide layer 4 at the edge 8 and rounding of the edges 8 between the upper surface 2a and the two lateral surfaces 2b of the web-type elevation 2.

Figure 3E:
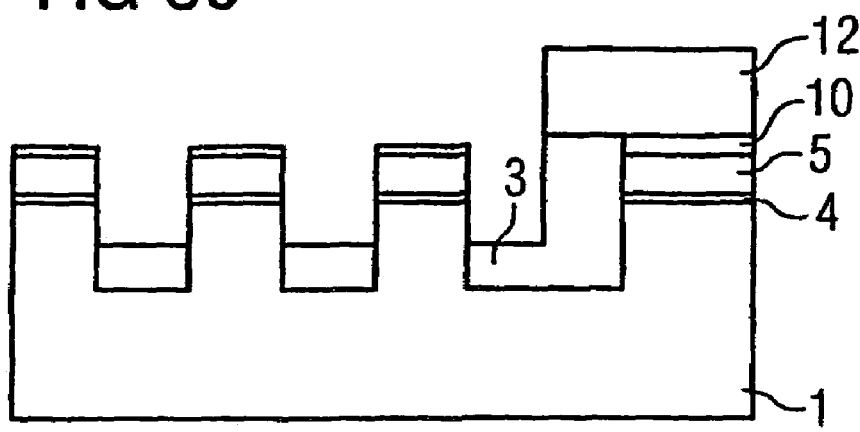

The STI oxide 3 is subsequently etched back in a planar manner down to a defined depth by means of anisotropic etching using a block mask 12, which covers all the regions for transistors without intended vertical channel extension. This etching has a certain selectivity with respect to the pad nitride layer 10, so that the upper surfaces 2a of the web-type elevations 2 still remain reliably covered with silicon nitride 10. The remaining STI filling depth is dimensioned so as to guarantee a later reliable field isolation. The resultant situation is shown in FIG. 3e.

Figure 3F:
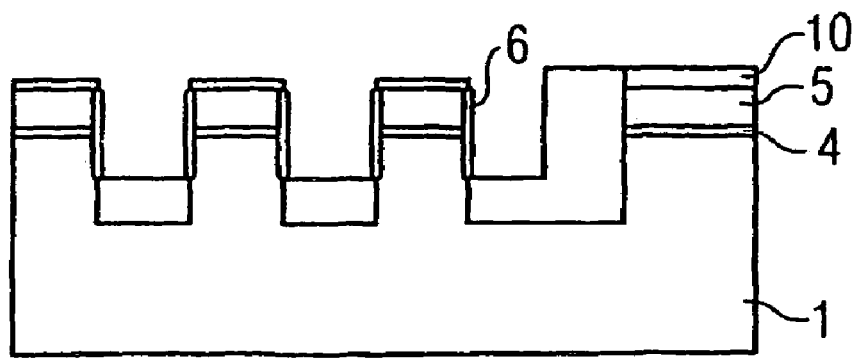
Figure 3G:
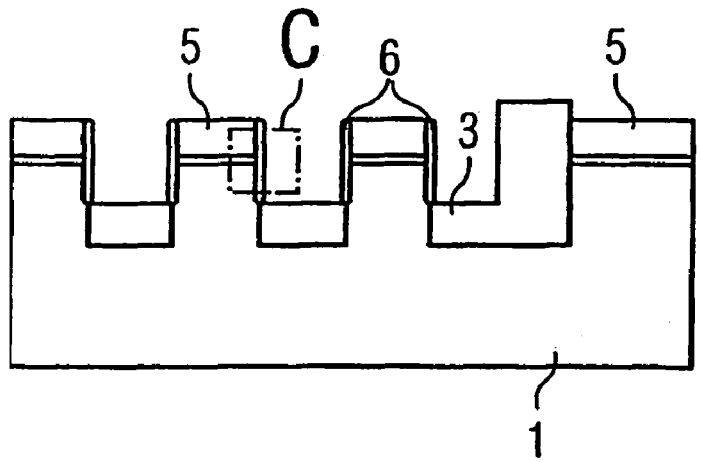
Figure 3G:
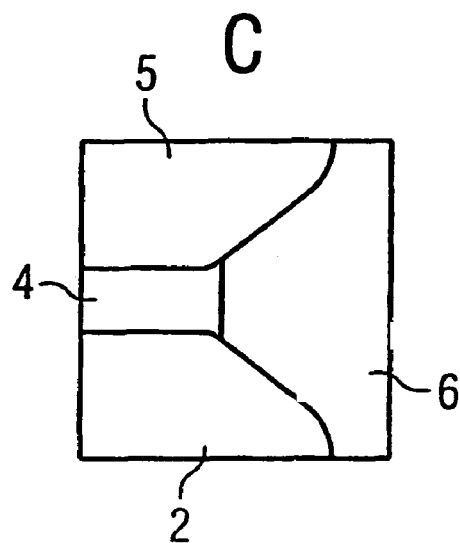
Figure 3H:
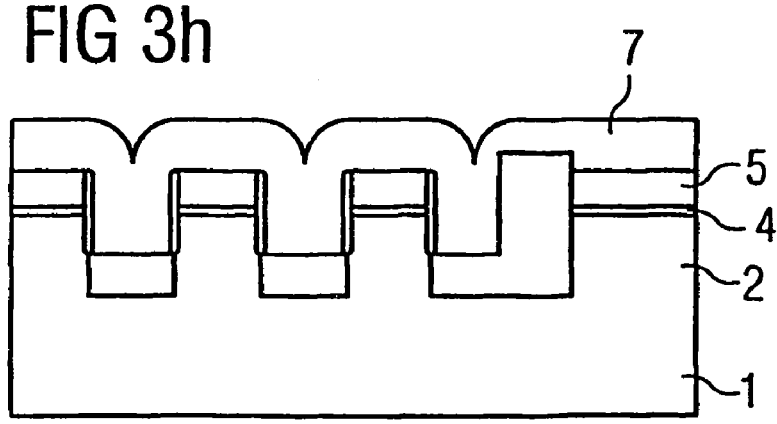

After the removal of the block mask, cleaning/overetching, the $2^{nd}$ gate oxidation is effected (FIG. 3f). In this case, the second gate oxide layer 6 grows on the uncovered sidewalls of the web-type elevation 2 and on the uncovered sidewalls of the first gate electrode layer 5. This oxidation step additionally widens the first gate oxide layer 4 at the edges 8 and further reduces the curvature of the substrate and poly edges. Afterward, the pad nitride residual layer 10 that remained on the surfaces of the first gate electrode layer is removed (FIG. 3g) and, after further cleaning, the second gate electrode layer 7 is deposited (FIG. 3h).

Afterward, using a mask (not shown), the first and second gate electrode layers are jointly patterned with the aid of etching, preferably plasma etching, the etching stopping in the first gate oxide layer. This is then followed by the further processing including fabrication of the source/drain regions through to the complete circuit in accordance with the conventional process sequence.

FIG. 4 shows a further embodiment of the field-effect transistor according to the invention. As can be seen from FIG. 4, the further embodiment of the field-effect transistor according to the invention also has a web-type elevation 2, which is arranged on a semiconductor substrate 1 and has an upper surface 2a and two lateral surfaces 2b. The web-type elevation 2 constitutes the active semiconductor region in this case.

The active semiconductor region with vertical connection to the semiconductor substrate is again laterally insulated from adjacent active regions by STI field isolation region 3. The surface of the active region is patterned into source and drain regions and planar channel regions. It projects above the STI surface, as a result of which the sidewalls of the active region are in part uncovered. These uncovered side walls, directly adjoining the corresponding planar regions, are patterned identically into source, drain and channel regions. The height difference between active and STI surface corresponds to the width of the vertical channel regions. The doping profile depth of the source and drain regions is preferably greater than said height difference.

The relief structure comprising active and sunk STI surface is thus covered by a dual gate electrode 5, 7 in the channel region. In this case, the first gate electrode 5 is preferably composed of highly doped polysilicon, while the second gate oxide 7 preferably has a polysilicon-metal layer stack. The two gate electrodes 5, 7 are arranged in such a way that the first gate electrode 5 covers exclusively the vertical part 2b of the active region 2 and terminates approximately with the upper surfaces thereof, while the second gate electrode 7 covers the upper surface of the active region 2 and encloses the first gate electrode 5. In this case, the second gate electrode makes contact with the first gate electrode on the lateral surfaces thereof, while it is insulated from the upper sidewalls thereof by the second gate oxide layer 6. The channel region is covered by the second gate oxide layer 6 on its planar part and by the first gate oxide layer 4 on its vertical areas.

FIG. 5 shows a further embodiment of the field-effect transistor according to the invention. The embodiment of the field-effect transistor according to the invention as shown in FIG. 5 essentially corresponds to the embodiment of the field-effect transistor according to the invention as shown in FIG. 2, with the exception that the second gate oxide layer 6 is made thicker on the lateral surfaces of the first gate electrode 5 than on the lateral surfaces 2b of the web-type elevation 2. The thickening of the second gate oxide layer 6 on the lateral surfaces of the first gate electrode 5 is achieved by a selective gate oxidation, exploiting the fact that, given suitably selected process parameters, a higher oxidation rate is obtained on polysilicon than on monocrystalline silicon.

FIG. 6 shows a further embodiment of the field-effect transistor according to the invention. The embodiment of the field-effect transistor according to the invention as shown in FIG. 6 essentially corresponds to the embodiment of the field-effect transistor according to the invention as shown in FIG. 2, with the exception that a spacer 14, in particular an oxide spacer, is arranged on the second gate oxide layer 6 at the level of the first gate electrode 5. In this case, the spacer 14 can be formed on the sidewalls of the first gate electrode layer 5 immediately after the patterning thereof, still before the formation of the web-type elevation 2. The oxidation for producing the second gate oxide layer 6 then reinforces this spacer 14 by an additional oxide layer directly on the lateral surfaces of the first gate electrode layer 5.

The field-effect transistor according to the invention has the advantage that a significant increase in the effective channel width for the forward current ION can be ensured compared with previously known, conventional transistor structures, without having to accept a reduction of the integration density that can be attained. In the case of the field-effect transistor according to the invention, the planar channel region at the upper surface of the elevation is extended in width by additional vertical channel regions at the side areas of the elevation. These additional vertical channel regions directly adjoin the planar channel region (vertical extended channel regions).

Furthermore, the field-effect transistor according to the invention has a small reverse current $I_{OFF}$. These advantages are obtained without having to reduce the thickness of the gate insulator into the region of the tunneling of charge carriers or reduced stability.

What is claimed is:

1. A field-effect transistor, comprising:
    at least one web-type elevation, which is arranged on a semiconductor substrate and has an upper surface and lateral surfaces;
    a first gate oxide layer, which is arranged on the upper surface of the web-type elevation;
    a first gate electrode, which is arranged on the first gate oxide layer, the first gate electrode having an upper surface and lateral surfaces;
    a second gate oxide layer, which is arranged at least on a part of the lateral surfaces of the web-type elevation and the first gate electrode;

a second gate electrode, which is arranged on the second gate oxide layer and the upper surface of the first gate electrodes; and source and drain regions, which are arranged on the web-type elevation.

2. The field-effect transistor as claimed in claim 1, wherein the second gate oxide layer is made thicker on the lateral surfaces of the first gate electrode than on the lateral surfaces of the web-type elevation.

3. The field-effect transistor as claimed in claim 1, wherein an insulating spacer is arranged on the second gate oxide layer at the level of the first gate electrode.

4. The field-effect transistor as claimed in claim 1, wherein 20 spacers are arranged between the source region and the gate electrodes and also between the drain region and the gate electrodes.

5. The field-effect transistor as claimed in claim 1, wherein the first gate electrodes has a polysilicon layer.

6. The field-effect transistor as claimed in claim 1, wherein the second gate electrode has a polysilicon-metal double layer or a polycide layer.

7. The field-effect transistor as claimed in claim 1, wherein the part of the lateral surfaces of the web-type elevation which is covered by a gate oxide layer is bounded by a trench isolation.

8. The field-effect transistor as claimed in claim 1, wherein the doping profile depth of the source and drain regions is greater than the extent of the part of the lateral surface of the web-type elevation which is covered by a gate oxide layer.

9. A field-effect transistor, comprising:
at least one web-type elevation, which is arranged on a semiconductor substrate and has an upper surface and lateral surfaces;

a first gate oxide layer, which is arranged at least on a part of the lateral surfaces of the web-type elevation;

a first gate electrodes, which is arranged on the first gate oxide layer, the first gate electrode having an upper surface and lateral surfaces;

a second gate oxide layer, which is arranged on the upper surface of the web-type elevation and the upper surface of the first gate electrode;

a second gate electrode, which is arranged on the second gate oxide layer and the lateral surfaces of the first gate electrodes; and source and drain regions, which are arranged on the web-type elevations.

10. The field-effect transistor as claimed in claim 1, wherein the edges of the web-type elevation are rounded between the upper surface and the lateral surfaces.

11. The field-effect transistor as claimed in claim 10, wherein the radius of curvature of the edges is of the order of magnitude of the layer thickness of the first or second gate oxide layer.

12. A method for fabricating a field-effect transistor, comprising:

providing a semiconductor substrate with a first gate oxide layer applied thereon and a first gate electrode layer applied to the gate oxide layer;

producing at least one web-type elevations with an upper surface and lateral surfaces, the first gate oxide layer and the first gate electrode layer being arranged on the upper surface;

producing a second gate oxide layer at least on a part of the lateral surfaces of the web-type elevations and the first gate electrode layer;

applying a second gate electrode layer is applied, so that the second gate electrode layer is arranged on the second gate oxide layer and the upper surface of the first gate electrode layer; and patterning the first and second gate electrode layers to form first and second gate electrodes and source and drain regions are produced.

13. The method as claimed in claim 12, wherein the web-type elevation is produced with the patterning of the trenches for a trench isolation.

14. The method as claimed in claim 13, wherein the trenches for the trench isolation are filled with oxide and etching-back is carried out, so that a part of the lateral surfaces of the web-type elevations is uncovered.

15. The method as claimed in claim 14, wherein a CMP step is carried out prior to the etching-back.

16. The method as claimed in claim 12, wherein at least one thermal process is carried out for rounding the edges of the web-type elevation between the upper surface and the lateral surfaces.

17. The method as claimed in claim 12, wherein the gate oxide layers are in each case produced by a thermal oxidation.

18. The method as claimed in claim 12, wherein the second gate oxide layer is produced by selective oxidation, so that the second gate oxide layer is made thicker on the lateral surfaces of the first gate electrode than on the lateral surfaces of the web-type elevation.

19. The method as claimed in claim 12, wherein an insulating spacer is produced after the production of the first gate electrode layer, so that an insulating spacer is arranged on the second gate oxide layer at the level of the first gate electrode.

* * * * *